(12) United States Patent
Fritz

(10) Patent No.: US 10,193,509 B1
(45) Date of Patent: Jan. 29, 2019

(54) POWER AMPLIFIER HARMONIC MATCHING NETWORK

(71) Applicant: Avago Technologies General IP (Singapore) Pte. Ltd, Singapore (SG)

(72) Inventor: Martin Fritz, Bavaria (DE)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/663,003

(22) Filed: Jul. 28, 2017

(51) Int. Cl.
| | |
|---|---|
| *H03F 3/16* | (2006.01) |
| *H03F 3/193* | (2006.01) |
| *H03F 3/60* | (2006.01) |
| *H03F 3/191* | (2006.01) |
| *H03F 1/56* | (2006.01) |
| *H03F 3/195* | (2006.01) |
| *H03F 3/21* | (2006.01) |
| *H03F 3/26* | (2006.01) |

(52) U.S. Cl.
CPC ........... *H03F 3/1935* (2013.01); *H03F 1/565* (2013.01); *H03F 3/191* (2013.01); *H03F 3/195* (2013.01); *H03F 3/211* (2013.01); *H03F 3/265* (2013.01); *H03F 3/604* (2013.01); *H03F 2200/225* (2013.01); *H03F 2200/451* (2013.01)

(58) Field of Classification Search
CPC .................................. H03F 3/16; H03F 3/191
USPC ......................................... 330/277, 302, 303
See application file for complete search history.

(56) References Cited

U.S. PATENT DOCUMENTS

| | | | |
|---|---|---|---|
| 6,885,260 B2 | 4/2005 | Nishimura et al. | |
| 6,924,715 B2* | 8/2005 | Beaudin | H03H 9/14547 330/306 |
| 7,053,717 B2* | 5/2006 | Gresham | H03F 1/26 330/150 |
| 8,350,627 B2 | 1/2013 | Hellberg | |
| 8,701,065 B1* | 4/2014 | Silver | H03H 9/465 333/133 |
| 2004/0130411 A1* | 7/2004 | Beaudin | H03H 9/14547 333/133 |
| 2014/0218128 A1 | 8/2014 | Fujita | |
| 2014/0266510 A1* | 9/2014 | Silver | H03H 9/465 333/186 |
| 2015/0236840 A1 | 8/2015 | Link et al. | |

OTHER PUBLICATIONS

Frederick H. Raab et al., "Class-F Power Amplifiers with Maximally Flat Waveforms," IEEE Transactions on Microwave Theory and Techniques, vol. 45, No. 11, Nov. 1997, pp. 2007-2012.

(Continued)

*Primary Examiner* — Henry Choe

(57) ABSTRACT

An output network connected to an output of a nonlinear unmatched power amplifier that provides an amplified voltage signal at a fundamental frequency. The output network includes multiple acoustic resonators configured to match multiple harmonic frequencies of the amplified voltage signal to one of substantially zero impedance, appearing as a short, or substantially infinite impedance, appearing as an open, resulting in zero voltage or zero current, respectively, to avoid power distribution at the higher harmonic frequencies. Each higher harmonic frequency is higher than a first harmonic frequency of the multiple harmonic frequencies, which is a fundamental frequency.

19 Claims, 4 Drawing Sheets

(56) References Cited

OTHER PUBLICATIONS

Chris Trask, "Class-F Amplifier Loading Networks: A Unified Design Approach," IEEE MTT-S International Microwave Symposium Digest, Year: 1999, vol. 1, pp. 351-354.
Frederick H. Raab et al., "RF and Microwave Power Amplifier and Transmitter Technologies—Parts 1 to 5," High Frequency Electronics, Summit Technical Media, LLC, May 2003, pp. 22-54.
Steve C. Cripps, "Chapter 4.3: Shorting the Harmonics", RF Power Amplifiers for Wireless Communications, Artech House Inc., 1999, pp. 88-90.

* cited by examiner

POWER AMPLIFIER HARMONIC MATCHING NETWORK

BACKGROUND

Portable communication devices, such as mobile (cellular) telephones, portable computers, personal digital assistants (PDAs), Global Navigation Satellite System (GNSS) (e.g., including global positioning system (GPS)) receivers, and the like, are configured to communicate over wireless networks. Such portable communication devices may enable communication over multiple networks, and therefore include transmitters and receivers, as well as corresponding filters, power amplifiers, switches and other radio frequency (RF) components and devices, for example, connecting the receivers and transmitters to a common antenna, for sending and receiving RF signals over the various networks.

Many RF components and devices are nonlinear, and therefore generating intermodulation distortion (IMD), which is an indication of linearity. Examples of nonlinear components and devices include power amplifiers, low noise amplifiers (LNAs), acoustic filters and switches. Other types of RF components may have nonlinear characteristics, such substrates formed of nonlinear materials. IMD generally describes the ratio between the power of fundamental (operation) tones and second-order distortion (IMD2) products or third-order distortion (IMD3) products. That is, a linear RF component may produce a two-tone output signal, for example, where the frequencies of the two tones are the same as the frequencies of the two tones in the input signal. A nonlinear component outputs signals at frequencies in addition to the frequencies of the original two tones as a result of IMD products. These IMD products may cause interference in multi-channel communication equipment, where the IMD products (and/or higher harmonics of the IMD products) are generated at other operation frequencies in different frequency bands and/or in other networks. Examples of IMD2 products generated by a two-tone (first and second frequencies $f_1$ and $f_2$) input signal include $f_1+f_2$, $f_2-f_1$, $2f_1$ and $2f_2$. Examples of IMD3 products generated by a two-tone input signal include $2f_1+f_2$, $f_1+2f_2$, $2f_1-f_2$, $2f_2-f_1$, $3f_1$ and $3f_2$. Notably, certain two-tone IMD3 products are typically close to the operation frequency/carrier frequency of the RF device, and therefore are very difficult or nearly impossible to filter out.

An additional requirement is the need for matching at higher harmonic frequencies, which requires a separate network (e.g., using short or open circuits), referred to as a harmonic matching network (or output network). The harmonic matching network ideally does not interact with the fundamental matching circuit, which provides impedance matching at the fundamental frequency of an RF voltage signal. With regard to power amplifiers in particular, the most important harmonic to remove at the transistor output typically is the second harmonic frequency. Conventionally, the second harmonic frequency is removed using a parallel resonant circuit, which was not difficult when the load is about 10K Ohms. However, assuming a load of 12.5 Ohms, for example, a transistor output of a power amplifier at 1.9 GHz provides values that at not realizable, as a practical matter. See, e.g., S. Cripps, "RF Power Amplifiers for Wireless Communications" (1999), p. 88, which is hereby incorporated by reference. This is particularly the case for mobile telephones, which generally include loads at about 4 Ohms, for example. Quarter wavelength transmission lines may also be used for harmonic matching. However the second harmonic of 3.8 GHz for application at 1.9 GHz (fundamental frequency), for example, requires a transmission line of about 19.7 mm, which is inconsistent with small package sizes.

FIG. 1 is a simplified schematic diagram of a conventional circuit including a nonlinear Class E power amplifier and harmonic matching network. Referring to FIG. 1, conventional amplifier circuit 100 includes a transistor 112, indicated by a switch, connected between voltage power supply ($V_{DD}$) and ground via inductors 111 and 114, and connected in parallel with capacitor 113. The transistor 112 provides an amplified voltage signal to the output 118 for load 150, via the inductor 111 and series capacitor 116, in response to a variable drive signal (not shown) received by the gate or base of the transistor 112, depending on whether the transistor 112 is a field effect transistor (FET) or a bipolar junction transistor (BJT), for example. The amplified voltage signal at the output 118 has a fundamental frequency ($f_0$).

As mentioned above, impedance matching at higher harmonic frequencies of the amplified voltage signal, in order to prevent interference caused by the higher harmonics, is attempted using only quarter wavelength transmission lines, indicated by representative transmission lines 121, 122 and 123, which provide the desired impedance at fundamental frequency. However, for frequency ranges up to about 5 GHz, and in particular for mobile phone applications, the quarter wavelength transmission lines 121 to 123 may be prohibitively long.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
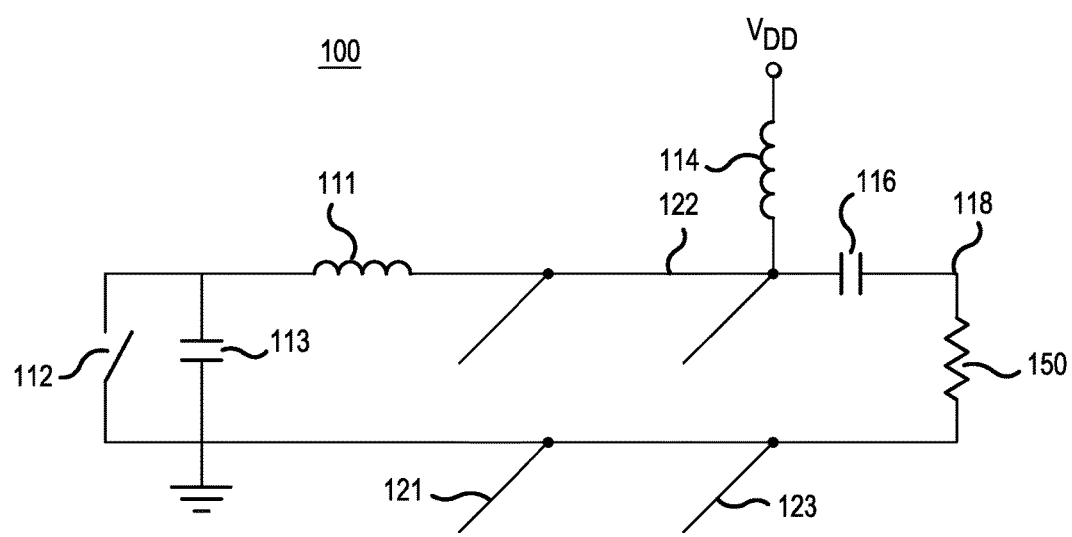
FIG. 1 is a simplified schematic diagram of a conventional circuit including a Class E power amplifier and harmonic matching network.

In the following detailed description, for purposes of explanation and not limitation, representative embodiments disclosing specific details are set forth in order to provide a thorough understanding of the present teachings. However, it will be understood by one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to with acceptable limits or degree. For example, two values being "substantially equal" means that one skilled in the art would consider the level of equality between the two values to be acceptable. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

It is understood that the drawings and the various elements depicted therein are not drawn to scale. Further, relative terms, such as "above," "below," "top," "bottom," "upper" and "lower" are used to describe the various elements" relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

Since IMD products cause interference in RF devices, the components must function under a specified maximum power level to attempt to avoid the interference. It may be difficult to determine and/or remove the non-linearity effects due to the non-linearity of a power amplifier, for example, particularly when addressing the various classes of power amplifiers (e.g., Class F, Class E, Class D, etc.). Thus, one or more frequency tones, which would mix due to the non-linear behavior of the power amplifier, may be suppressed, according to various embodiments, by creating an open or short circuit, for example, as discussed below. Because, when at least one of the mixing tones is suppressed, the generation of the corresponding IMD product is not possible.

Accordingly, various embodiments of the disclosure provide a circuit that includes an unmatched nonlinear power amplifier, a harmonic matching network, and a load (e.g., represented by resistance or complex impedance). The unmatched nonlinear power amplifier includes a transistor connected between a voltage power supply and a reference ground voltage, the transistor providing an amplified voltage signal at an output in response to a variable drive signal, the amplified voltage signal having a fundamental frequency. The harmonic matching network is connected to the output of the nonlinear unmatched power amplifier, and configured to receive the amplified voltage signal at the fundamental frequency and to prevent power distribution at multiple higher harmonic frequencies of the fundamental frequency. The harmonic matching network includes multiple acoustic resonators configured to match the higher harmonic frequencies of the amplified voltage signal, respectively, to one of substantially zero impedance (also referred to herein as a short or to short out) or substantially infinite impedance (also referred to herein as an open or to open), where each higher harmonic frequency is higher than the fundamental frequency, and a harmonic matching network output. In this context, "substantially" zero impedance refers to a value of impedance so low that it has negligible or no practical affect on current flow (resulting in zero voltage), and "substantially" infinite impedance refers to a value of impedance so high that it allows only a negligible amount of current flow or prevents current flow, as a practical matter (resulting in zero current). The load is between the harmonic matching network output and the reference ground voltage.

Figure 2A:
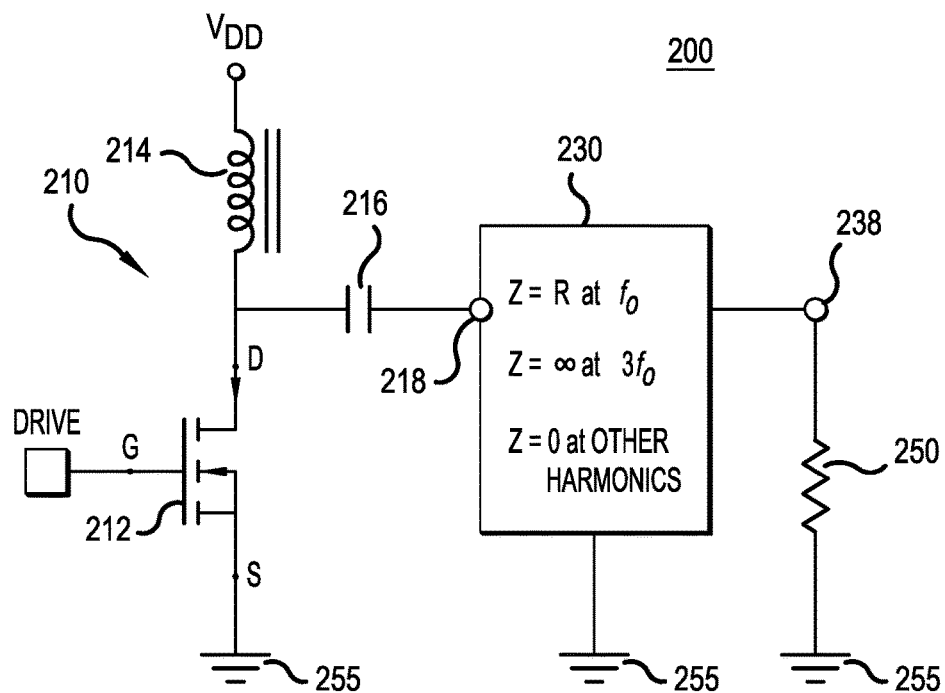
FIG. 2A is a simplified schematic diagram of a nonlinear matched Class F power amplifier with harmonic matching network, according to a representative embodiment.
Figure 2B:
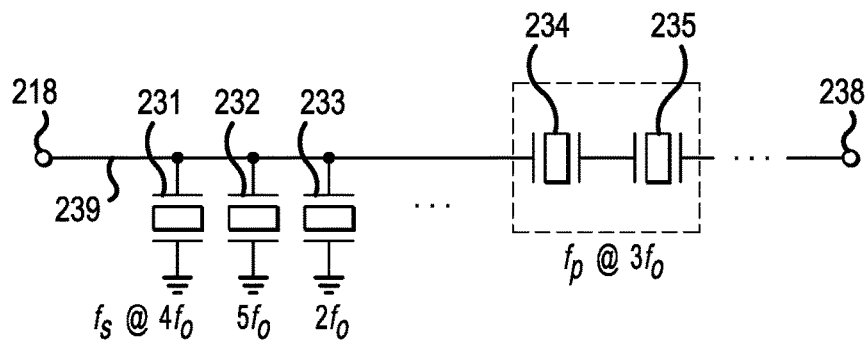
FIG. 2B is a simplified schematic diagram of harmonic matching network shown in FIG. 2A using shunt and series acoustic resonators, according to a representative embodiment.

FIG. 2A is a simplified schematic diagram of a matched Class F power amplifier with harmonic matching network, and FIG. 2B is a simplified schematic diagram of the harmonic matching network shown in FIG. 2A using acoustic resonators, according to a representative embodiment. More particularly, FIGS. 2A and 2B depict a third harmonic peaking Class F power amplifier. The harmonic matching network may also be referred to as an output network.

Referring to FIG. 2A, matched power amplifier 200 (referred to simply as "power amplifier 200") includes a nonlinear unmatched power amplifier 210, a harmonic matching network 230 connected to an output 218 of the unmatched power amplifier 210, and a load 250 arranged between an output 238 of the harmonic matching network 230 (which is also the output of the power amplifier 200) and reference ground voltage 255.

For the sake of convenience, FIG. 2A shows only the output stage of the unmatched power amplifier 210. The unmatched power amplifier 210 includes a transistor 212 connected between voltage power supply ($V_{DD}$) and reference ground voltage 255. The transistor 212 provides an amplified voltage signal at the output 218 in response to a variable drive signal DRIVE, where the amplified voltage signal has a fundamental frequency ($f_0$). The variable drive signal DRIVE may be an amplitude modulated signal, for example. The nonlinear unmatched power amplifier 210 further includes an RF choke (RFC) inductance (indicated by inductor 214) connected between the transistor 212 and $V_{DD}$, and DC blocking (DCB) capacitance (indicated by capacitor 216) connected between the transistor 212 and the output 218. The output 218 of the unmatched power amplifier 210 is also the input of the harmonic matching network 230.

In the depicted embodiment, the transistor 212 is a field effect transistor (FET), which includes a gate (G) for receiving the variable drive signal DRIVE. The transistor 212 also includes a source (S) connected to the reference ground voltage 255, and a drain (D) connected to the voltage power supply $V_{DD}$ via the inductor 214 and connected to the output 218 of the unmatched power amplifier 210 via the capacitor 216. In an alternative embodiment, the transistor 212 may be a bipolar junction transistor (BJT), which includes a base for receiving the variable drive signal DRIVE. The BJT would also include an emitter connected to the reference ground voltage 255, and a collector connected to the voltage power supply $V_{DD}$ via the inductor 214 and connected to the output 218 of the unmatched power amplifier 210 via the capacitor 216.

The harmonic matching network 230 is connected to the output 218 of the unmatched power amplifier 210, and includes multiple acoustic resonators configured to match the higher harmonic frequencies of the amplified voltage signal, respectively, to impedances (Z), where each matching impedance is substantially zero (short) or substantially infinite (open), as mentioned above. Generally, higher harmonic frequencies are the harmonics higher than the fundamental frequency (e.g., $2f_0$, $3f_0$, $4f_0$, $5f_0$, and so on). The harmonic matching network 230 is thus configured to receive the amplified voltage signal, and to provide a match to the load 250 at fundamental frequency, and to prevent power distribution at the higher harmonic frequencies of the fundamental frequency. More particularly, for the third harmonic peaking nonlinear Class F power amplifier 200, the impedance (Z) of the harmonic matching network 230 is substantially equal to resistance (R) of the load 250 at the fundamental frequency ($f_0$) of the amplified voltage signal, is substantially infinite (open) at the third harmonic frequency ($3f_0$), and is substantially zero (shorted out) at the higher harmonic frequencies other than the third harmonic frequency, for both even and odd harmonics (e.g., $2f_0$, $4f_0$, $5f_0$, and so on).

Referring to FIG. 2B, an illustrative arrangement of series and shunt acoustic resonators of the harmonic matching network 230 is shown connected to transmission line 239, which extends between the output 218 of the unmatched power amplifier 210 and the output 238 of the harmonic matching network 230. In particular, the depicted harmonic matching network 230 includes shunt acoustic resonators 231, 232 and 233 connected in parallel with one another between the transmission line 239 and the reference ground voltage 255, and series acoustic resonators 234 and 235 connected in series with one another along the transmission line 239. In FIG. 2B, the transmission line provides an electrical connection, and does not act as an impedance transformer, for example, because the electrical length of the transmission line 239 is relatively short in comparison to the wavelength of the amplified voltage signal, as discussed below with reference to FIGS. 3B, 3C, 4B and 4C. The shunt acoustic resonators 231, 232 and 233 are connected to the input side (e.g., at output 218) of the harmonic matching network 230, and the series acoustic resonators 234 and 235 are connected to the output side (e.g., at output 238) of the harmonic matching network 230. For purposes of explanation, the shunt acoustic resonators 231, 232 and 233, and the series acoustic resonators 234 and 235 are indicated as thin film bulk acoustic resonators (FBARs), although it is understood that other types of acoustic resonators, such as surface acoustic wave (SAW) resonators, may be incorporated without departing from the scope of the present teachings.

The shunt acoustic resonator 231 has a series resonance frequency (fs) at the fourth harmonic frequency $4f_0$ to short out (substantially zero impedance) the fourth harmonic frequency $4f_0$, the shunt acoustic resonator 232 has a series resonance frequency at the fifth harmonic frequency $5f_0$ to short out the fifth harmonic frequency $5f_0$, and the shunt acoustic resonator 233 has a series resonance frequency at the second harmonic frequency $2f_0$ to short out the second harmonic frequency $2f_0$ of the amplified voltage signal. Additional shunt acoustic resonators may be added respectively to short out any additional harmonic frequencies, other than the third harmonic frequency $3f_0$, as desired. For purposes of explanation, each of the shunt acoustic resonators 231, 232 and 233 is shown as a single acoustic resonator, although it is understood that the required series resonance frequency of each (or one or more) of the shunt acoustic resonators 231, 232 and 233 may alternatively be provided by multiple acoustic resonators (as opposed to a single acoustic resonator, as shown) having a combined series resonance frequency that matches the required series resonance frequency, without departing from the scope of the present teachings. So generally, at least one shunt acoustic resonator has a corresponding series resonance frequency that matches impedance at an $N^{th}$ harmonic of the fundamental frequency of the amplified voltage signal, where N is an integer greater than one but not equal to three, to short out the corresponding $N^{th}$ harmonic frequency of the amplified voltage signal output by the unmatched power amplifier 210.

The series acoustic resonators 234 and 235 have a combined parallel resonance frequency (fp) at the third harmonic frequency $3f_0$ to provide an open (substantially infinite impedance) at the third harmonic frequency $3f_0$ of the amplified voltage signal. Again, two series acoustic resonators are shown for purposes of explanation, and it is understood that the required parallel resonance frequency may alternatively be provided by a single acoustic resonator, or by more than two acoustic resonators connected in series, without departing from the scope of the present teachings. The number of acoustic resonators connected in series depends, at least in part, on the bandwidth of the amplified voltage signal. So generally, at least one series acoustic resonator has a corresponding parallel resonance frequency matching the third harmonic of the fundamental frequency of the amplified voltage signal output by the third harmonic peaking nonlinear Class F power amplifier 200.

The configuration of the harmonic matching network 230 is space saving in that it requires less area than conventional techniques involving quarter wavelength transmission lines and/or LC circuits. For example, for an amplified voltage signal having a fundamental frequency of about 1.9 GHz, the transmission line 239 requires an area of about 5,000 $\mu m^2$ (or, more generally, an area in a range from about 100 $\mu m^2$ to about 50,000 $\mu m^2$), as compared to the transmission line having a length of about 19.7 mm in a conventional harmonic matching network, as discussed above, which requires an area of at least about 3,980,000 $\mu m^2$, for example. In addition, due to the configuration of acoustic resonators of the harmonic matching network 230, the power amplifier 200 is able to replace and/or supplement band stop filters that may otherwise be necessary elsewhere in the circuit. Also, in various embodiments, the DCB capacitor 216 may be omitted due to the DC blocking capability of the acoustic resonators. The harmonic matching networks 330 and 430 described below provide similar space savings (that is, required areas are orders of magnitude smaller than conventional counterparts).

Figure 3A:
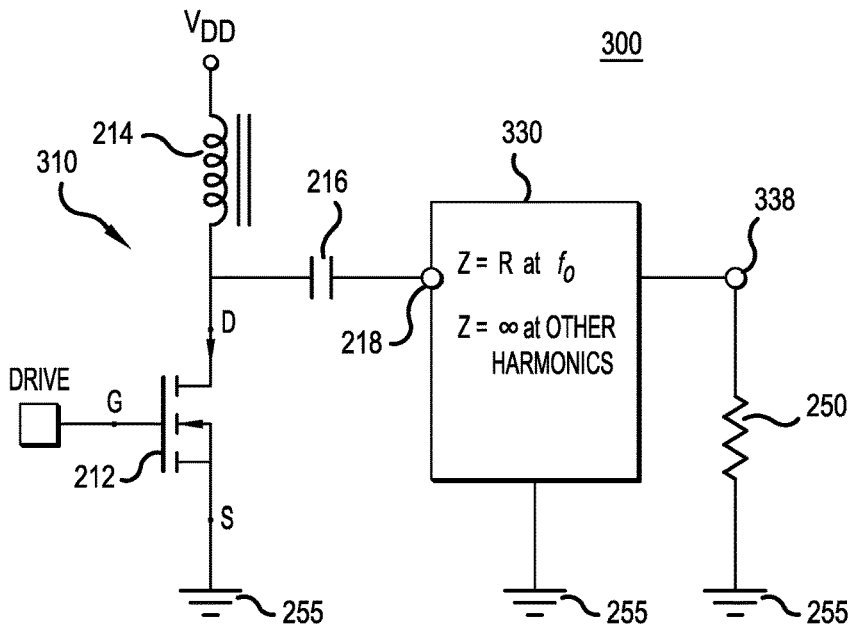
FIG. 3A is a simplified schematic diagram of a nonlinear matched Class E power amplifier with harmonic matching network, according to a representative embodiment.
Figure 3B:
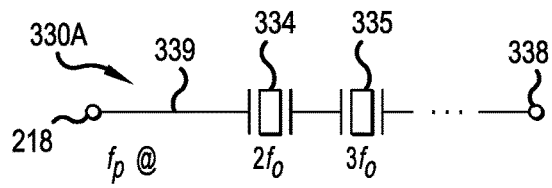
FIG. 3B is a simplified schematic diagram of harmonic matching network shown in FIG. 3A using series acoustic resonators, according to a representative embodiment.
Figure 3C:
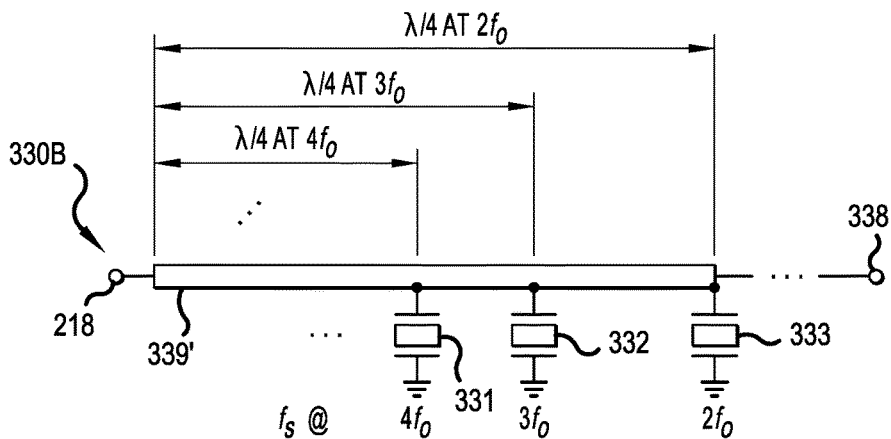
FIG. 3C is a simplified schematic diagram of harmonic matching network shown in FIG. 3A using a series transmission line and shunt acoustic resonators, according to a representative embodiment.

FIG. 3A is a simplified schematic diagram of a matched Class E power amplifier with harmonic matching network, according to a representative embodiment. FIG. 3B is a simplified schematic diagram of the harmonic matching network shown in FIG. 3A using series connected acoustic resonators, and FIG. 3C is a simplified schematic diagram of the harmonic matching network shown in FIG. 3A using a series transmission line and shunt connected acoustic resonators, according to representative embodiments.

Referring to FIG. 3A, matched power amplifier 300 (referred to simply as "power amplifier 300") includes a nonlinear unmatched power amplifier 310, a harmonic matching network 330 connected to an output 218 of the unmatched power amplifier 310, and a load 250 arranged between an output 338 of the harmonic matching network 330 and reference ground voltage 255. The unmatched power amplifier 310 includes a transistor 212 connected between voltage power supply ($V_{DD}$) and reference ground voltage 255, an RFC inductor 214 connected between the transistor 212 and $V_{DD}$, and DCB capacitor 216 connected between the transistor 212 and the output 218. The output 218 of the unmatched power amplifier 310 is also the input of the harmonic matching network 330. The unmatched power amplifier 310 is substantially the same as the unmatched power amplifier 210 discussed above with reference to FIG. 2A, and thus the additional description will not be repeated herein.

The harmonic matching network 330 connected to the output 218 of the unmatched power amplifier 310 includes multiple acoustic resonators configured to match the higher harmonic frequencies of the amplified voltage signal, respectively, to impedances (Z), where each matching impedance is substantially zero (short) or substantially infinite (open), as discussed below. The harmonic matching network 330 is thus configured to receive the amplified voltage signal at the fundamental frequency, and to prevent power distribution at the higher harmonic frequencies of the fundamental frequency. More particularly, for the nonlinear Class E power amplifier 300, the impedance (Z) of the harmonic matching network 330 is substantially equal to the resistance (R) of the load 250 at the fundamental frequency ($f_0$) of the amplified voltage signal, and is substantially infinite (open) at the higher harmonic frequencies, for both even and odd harmonics (e.g., $2f_0$, $3f_0$, $4f_0$, $5f_0$, and so on). The number of higher harmonic frequencies for which an open is provided (substantially infinite impedance) may vary to provide unique benefits for any particular situation or to meet application specific design requirements of various implementations, as would be understood by one skilled in the art.

Referring to FIG. 3B, an illustrative arrangement 330A of the harmonic matching network 330 shows series acoustic resonators 334 and 335 connected to transmission line 339, which extends between the output 218 of the unmatched power amplifier 310 and the output 338 of the harmonic matching network 330 (the output 338 also being the output of the power amplifier 300). In particular, the depicted harmonic matching network 330 includes series acoustic resonators 334 and 335 connected in series with one another along the transmission line 339. In FIG. 3B, the transmission line provides an electrical connection, and does not act as an impedance transformer, because the electrical length of the transmission line 339 is relatively short in comparison to the wavelength of the amplified voltage signal. For purposes of explanation, the series acoustic resonators 334 and 335 are indicated as FBARs, although it is understood that other types of acoustic resonators, such as SAW resonators, may be incorporated without departing from the scope of the present teachings.

The series acoustic resonator 334 has a parallel resonance frequency (fp) at the second harmonic frequency $2f_0$ to provide an open at the second harmonic frequency $2f_0$, and the series acoustic resonator 235 has a parallel resonance frequency at the third harmonic frequency $3f_0$ to provide an open at the third harmonic frequency $3f_0$ of the amplified voltage signal. As mentioned above, additional series acoustic resonators may be included to provide opens at additional higher harmonic frequencies of the fundamental frequency.

Also, for purposes of explanation, each of the series acoustic resonators 334 and 335 is shown as a single acoustic resonator, although it is understood that the required parallel resonance frequency of each (or one or more) of the series acoustic resonators 334 and 335 may alternatively be provided by multiple acoustic resonators (as opposed to a single acoustic resonator, as shown) having a combined parallel resonance frequency that matches the required parallel resonance frequency for providing an open at the corresponding higher harmonic, without departing from the scope of the present teachings. So generally, at least one series acoustic resonator has a corresponding parallel resonance frequency that matches impedance at an $N^{th}$ harmonic of the fundamental frequency of the amplified voltage signal, where N is an integer greater than one, to provide an open (substantially infinite impedance) at the corresponding $N^{th}$ harmonic frequency of the amplified voltage signal output by the Class E power amplifier 300. The number of acoustic resonators connected in series to provide an open at a particular higher harmonic frequency depends, at least in part, on the bandwidth of the amplified voltage signal.

Referring to FIG. 3C, an illustrative arrangement 330B of the harmonic matching network 330 shows shunt acoustic resonators 331, 332 and 333 connected to series transmission line 339' at predetermined lengths. The predetermined lengths correspond substantially to quarter wavelengths of the higher harmonics, in order to transform individual shorts via the shunt acoustic resonators 331, 332 and 333 at the corresponding higher harmonics to opens at the output 218 of the unmatched power amplifier 310, discussed below. That is, each of the shunt acoustic resonators 331, 332 and 333 is located at a distance from the output 218 of the unmatched power amplifier 310 that provides an electrical length between each of the shunt acoustic resonators 331, 332 and 333 and the output 218, respectively, substantially equal to a quarter wave of the higher harmonic frequency corresponding to each of the shunt acoustic resonators 331, 332 and 333. In this context, "substantially" means that the predetermined lengths may not exactly coincide with the respective quarter wavelengths, e.g., taking parasitics into account. This causes each of the higher harmonic frequencies to appear as an open at the output 218 of the unmatched power amplifier 310 (by shorting the series transmission line 339' to ground by the shunt acoustic resonators 331, 332 and 333 at the corresponding higher harmonic frequencies). Generally, the distances from the output 218 of the unmatched power amplifier 310 and the shunt acoustic resonators 331, 332 and 333, respectively, are shorter for increasingly higher harmonic frequencies.

More particularly, the depicted arrangement 330B of the harmonic matching network 330 includes the shunt acoustic resonators 331, 332 and 333 connected in parallel with one another between the series transmission line 339' and the reference ground voltage 255. Notably, the series transmission line 339' in FIG. 3C is depicted thicker than the transmission line 339 in FIG. 3B because, in addition to providing an electrical connection, the series transmission line 339' acts as an impedance transformer since the electrical length of the series transmission line 339' is not relatively short in comparison to the wavelength of the amplified voltage signal. The characteristic impedance of the series transmission line 339' is physically dependent on line width and technically dependent on the application (e.g., from the desired impedance of the load 250). For purposes of explanation, the shunt acoustic resonators 331, 332 and 333 are indicated as FBARs, although it is understood that other types of acoustic resonators, such as SAW resonators may be incorporated, without departing from the scope of the present teachings.

The shunt acoustic resonator 331 has a series resonance frequency (fs) at the fourth harmonic frequency $4f_0$, and is connected to the series transmission line 339' substantially a quarter wavelength of the fourth harmonic from the output 218. Accordingly, the amplified voltage signal output by the unmatched power amplifier 310 sees an open at the fourth harmonic frequency $4f_0$ because the short at the fourth harmonic frequency $4f_0$ via the shunt acoustic resonator 331 is transformed by the electrical length of the series transmission line 339' where the shunt acoustic resonator 331 connects. Similarly, the shunt acoustic resonator 332 has a series resonance frequency at the third harmonic frequency $3f_0$, and is connected to the series transmission line 339' substantially a quarter wavelength of the third harmonic from the output 218, and the shunt acoustic resonator 333 has a series resonance frequency at the second harmonic frequency $2f_0$, and is connected to the series transmission line 339' substantially a quarter wavelength of the second harmonic from the output 218. Thus, the unmatched power amplifier 310 sees opens at the third harmonic frequency $3f_0$ and the second harmonic frequency $2f_0$, as well.

For purposes of explanation, each of the shunt acoustic resonators 331, 332 and 333 is shown as a single acoustic resonator, although it is understood that the required series resonance frequency of each (or one or more) of the shunt acoustic resonators 331, 332 and 333 may alternatively be provided by multiple acoustic resonators (as opposed to a single acoustic resonator, as shown) having a combined series resonance frequency that matches the required series resonance frequency, without departing from the scope of the present teachings. So generally, at least one shunt acoustic resonator has a corresponding series resonance frequency that matches the impedance at an $N^{th}$ harmonic of the fundamental frequency of the amplified voltage signal and is connected to a series transmission line a quarter wavelength of the $N^{th}$ harmonic from the power amplifier output, where N is an integer greater than one, to provide an open at the corresponding $N^{th}$ harmonic frequency of the amplified voltage signal.

Figure 4A:
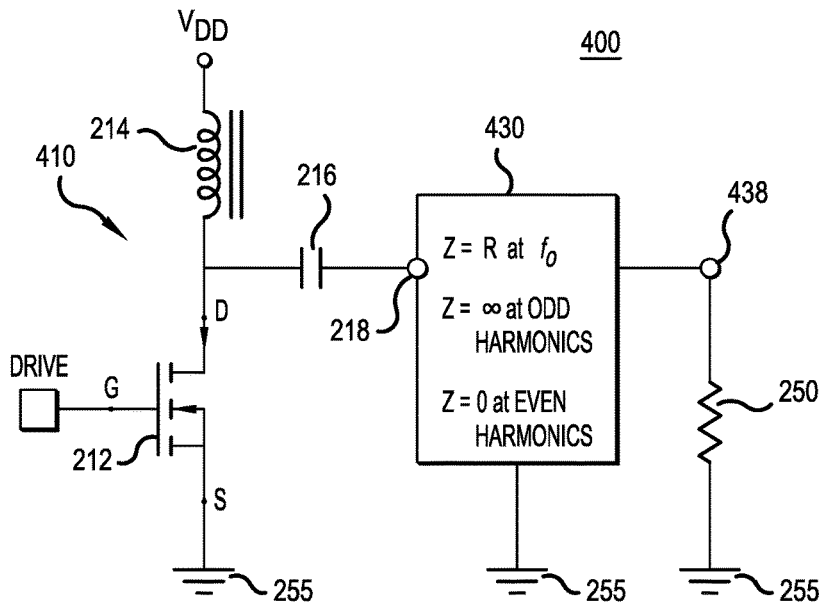
FIG. 4A is a simplified schematic diagram of a nonlinear matched Class D power amplifier with harmonic matching network, according to a representative embodiment.
Figure 4B:
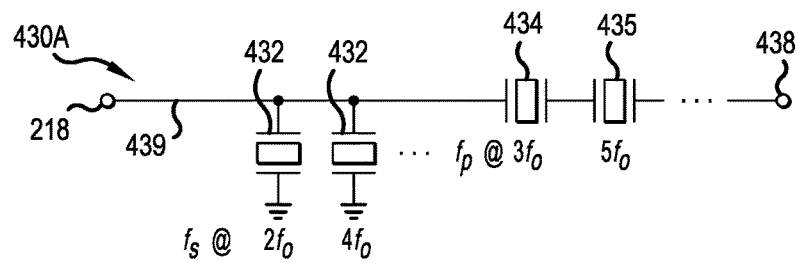
FIG. 4B is a simplified schematic diagram of harmonic matching network shown in FIG. 4A using shunt and series acoustic resonators
Figure 4C:
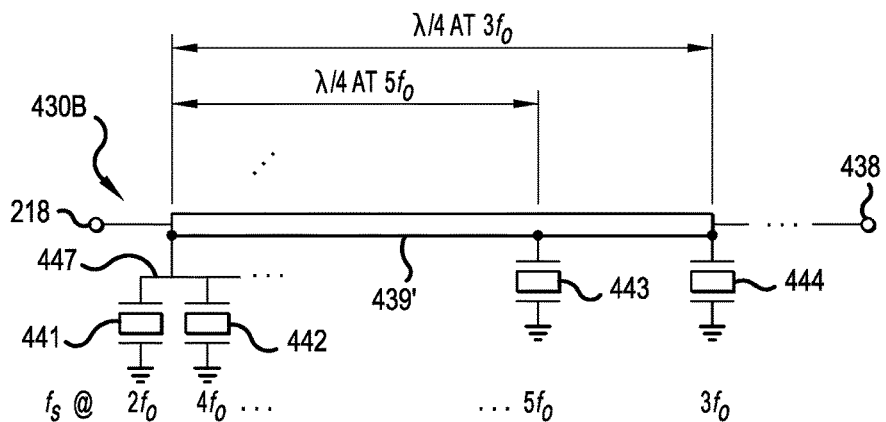
FIG. 4C is a simplified schematic diagram of harmonic matching network shown in FIG. 4A using a series transmission line and shunt acoustic resonators, according to a representative embodiment.

FIG. 4A is a simplified schematic diagram of a matched Class D power amplifier with harmonic matching network, according to a representative embodiment. FIG. 4B is a simplified schematic diagram of the harmonic matching network shown in FIG. 4A using shunt and series connected acoustic resonators, and FIG. 4C is a simplified schematic diagram of the harmonic matching network shown in FIG. 4A using a series transmission line and shunt connected acoustic resonators, according to representative embodiments.

Referring to FIG. 4A, matched power amplifier 400 (referred to simply as "power amplifier 400") includes a nonlinear unmatched power amplifier 410, a harmonic matching network 430 connected to an output 218 of the unmatched power amplifier 410, and a load 250 arranged between an output 438 of the harmonic matching network 430 (which is also the output of the matched power amplifier 400) and reference ground voltage 255. The unmatched power amplifier 410 includes a transistor 212 connected between voltage power supply ($V_{DD}$) and reference ground voltage 255, an RFC inductor 214 connected between the transistor 212 and $V_{DD}$, and DCB capacitor 216 connected between the transistor 212 and the output 218. The output 218 of the unmatched power amplifier 410 is also the input of the harmonic matching network 430. The unmatched power amplifier 410 is substantially the same as the unmatched power amplifier 210 discussed above with reference to FIG. 2A, and thus the additional description will not be repeated.

The harmonic matching network 430 connected to the output 218 of the unmatched power amplifier 410 includes multiple acoustic resonators configured to match the higher harmonic frequencies of the amplified voltage signal, respectively, to impedances (Z), where each matching impedance is substantially zero (short) or substantially infinite (open), as discussed below. The harmonic matching network 430 is thus configured to receive the amplified voltage signal at the fundamental frequency, and to prevent power distribution at the higher harmonic frequencies of the fundamental frequency.

More particularly, for the nonlinear Class D power amplifier 400, the impedance (Z) of the harmonic matching network 430 is substantially equal to the resistance (R) of the load 250 at the fundamental frequency ($f_0$) of the amplified voltage signal, is substantially infinity (open) at the odd higher harmonic frequencies, and is substantially zero (short) at the even higher harmonic frequencies. This results in an approximately square waveform of the amplified voltage signal ultimately output by the harmonic matching network 430. The number of higher harmonic frequencies for which an open or a short is provided may vary to provide unique benefits for any particular situation or to meet application specific design requirements of various implementations, as would be understood by one skilled in the art.

Referring to FIG. 4B, an illustrative arrangement 430A of the harmonic matching network 430 shows shunt and series acoustic resonators connected to transmission line 439, which extends between the output 218 of the unmatched power amplifier 410 and the output 438 of the harmonic matching network 430. In particular, the depicted harmonic matching network 430 includes shunt acoustic resonators 431 and 432 connected in parallel with one another between the transmission line 439 and the reference ground voltage 255, and series acoustic resonators 434 and 435 connected in series with one another along the transmission line 439. The shunt acoustic resonators 431 and 432 are connected to the input side (e.g., at output 218) of the harmonic matching network 430, and the series acoustic resonators 434 and 435 are connected to the output side (e.g., at output 438) of the harmonic matching network 430. For purposes of explanation, the shunt acoustic resonators 431 and 432, and the series acoustic resonators 434 and 435 are indicated as FBARs, although it is understood that other types of acoustic resonators, such as SAW resonators, may be incorporated without departing from the scope of the present teachings. Also, in FIG. 4B, the transmission line 439 provides an electrical connection, and does not act as an impedance transformer, because the electrical length of the transmission line 439 is relatively short in comparison to the wavelength of the amplified voltage signal.

The shunt acoustic resonator 431 has a series resonance frequency (fs) at the second harmonic frequency $2f_O$ to short out the second harmonic frequency $2f_O$, and the shunt acoustic resonator 432 has a series resonance frequency at the fourth harmonic frequency $4f_O$ to short out the fourth harmonic frequency $4f_O$ of the amplified voltage signal. Additional shunt acoustic resonators may be added respectively to short out any additional even harmonic frequencies, as desired. For purposes of explanation, each of the shunt acoustic resonators 431 and 432 is shown as a single acoustic resonator, although it is understood that the required series resonance frequency of each (or one or more) of the shunt acoustic resonators 431 and 432 may alternatively be provided by multiple acoustic resonators (as opposed to a single acoustic resonator, as shown) having a combined series resonance frequency that matches the required series resonance frequency, without departing from the scope of the present teachings.

The series acoustic resonator 434 has a parallel resonance frequency (fp) at the third harmonic frequency $3f_O$ to provide an open at the third harmonic frequency $3f_O$, and the series acoustic resonator 435 has a parallel series resonance frequency at the fifth harmonic frequency $5f_O$ to short out the fifth harmonic frequency $5f_O$ of the amplified voltage signal. Additional series acoustic resonators may be added respectively to short out any additional odd harmonic frequencies, as desired. For purposes of explanation, each of the series acoustic resonators 434 and 435 is shown as a single acoustic resonator, although it is understood that the required parallel resonance frequency of each (or one or more) of the series acoustic resonators 434 and 435 may alternatively be provided by multiple acoustic resonators (as opposed to a single acoustic resonator, as shown) having a combined parallel resonance frequency that matches the required parallel resonance frequency, without departing from the scope of the present teachings.

So generally, referring to FIG. 4B, at least one shunt acoustic resonator has a corresponding series resonance frequency that matches impedance at an $N^{th}$ harmonic of the fundamental frequency of the amplified voltage signal, where N is an even integer, to short out (provide substantially zero impedance) the corresponding $N^{th}$ harmonic frequency of the amplified voltage signal output by the nonlinear unmatched power amplifier 410. Also, at least one series acoustic resonator has a corresponding parallel resonance frequency that matches impedance at an $M^{th}$ harmonic of the fundamental frequency of the amplified voltage signal, where M is an odd integer greater than one, to provide an open (substantially infinite impedance) at the corresponding $M^{th}$ harmonic frequency of the amplified voltage signal output by the nonlinear unmatched power amplifier 410.

Referring to FIG. 4C, an illustrative arrangement 430B of the harmonic matching network 430 shows shunt acoustic resonators 443 and 444 connected to a series transmission line 439' at predetermined lengths, corresponding to quarter wavelengths of the odd higher harmonics of the amplified voltage signal. The shunt acoustic resonators 443 and 444 are connected to the output 218 of the harmonic matching network 430. This causes the impedance of each of the higher harmonic frequencies to appear as an open at the output 218 of the unmatched power amplifier 410 (by shorting the series transmission line 439' to ground by the shunt acoustic resonators at the corresponding higher harmonic frequency). That is, each of the shunt acoustic resonators 443 and 444 is located at a distance from the output 218 of the unmatched power amplifier 410 that provides an electrical length between each of the shunt acoustic resonators 443 and 444 and the output 218, respectively, substantially equal to a quarter wave of the odd higher harmonic frequency corresponding to each of the shunt acoustic resonators 443 and 444.

So, for example, the shunt acoustic resonator 443 has a series resonance frequency (fs) at the fifth harmonic frequency $5f_O$, and is connected to the series transmission line 439' substantially a quarter wavelength of the fifth harmonic from the output 218. Accordingly, the amplified voltage signal output by the unmatched power amplifier 410 sees an open at the fifth harmonic frequency $5f_O$ because the short at the fifth harmonic frequency $5f_O$ via the shunt acoustic resonator 443 is transformed by the electrical length of the series transmission line 439' where the shunt acoustic resonator 531 connects. Generally, the distances from the output 218 of the unmatched power amplifier 410 and the shunt acoustic resonators 443 and 444, respectively, are shorter for increasingly higher odd higher harmonic frequencies.

In addition, the illustrative arrangement 430B of the harmonic matching network 430 shows shunt acoustic resonators 441 and 442 connected in parallel with one another between the output 218 of the unmatched power amplifier 410 and the reference ground 225 via connecting line 447. The shunt acoustic resonator 441 has a series resonance frequency (fs) at the second harmonic frequency $2f_O$ and the shunt acoustic resonator 442 has a series resonance frequency at the fourth harmonic frequency $4f_O$, causing each of the second harmonic frequency $2f_O$ and the fourth harmonic frequency $4f_O$, respectively, to appear as a short at the output 218 of the unmatched power amplifier 410 (by shorting the series transmission line 439' at the output 218 to ground by the shunt acoustic resonators at the corresponding even higher harmonic frequency). Additional shunt acoustic resonators may be added in parallel with the shunt acoustic resonators 441 and 442 respectively to short out any additional even harmonic frequencies, as desired.

So generally, referring to FIG. 4C, at least one shunt acoustic resonator has a corresponding series resonance frequency that matches impedance at an $N^{th}$ harmonic of the fundamental frequency of the amplified voltage signal, where N is an even integer, to cause the corresponding impedance at the $N^{th}$ harmonic frequency of the amplified voltage signal output by the unmatched power amplifier 410 to appear as a short (substantially zero impedance). Also, at least one shunt acoustic resonator has a corresponding series resonance frequency that matches impedance at an $M^{th}$ harmonic of the fundamental frequency of the amplified voltage signal, where M is an odd integer greater than one, to cause the corresponding impedance at the $M^{th}$ harmonic frequency of the amplified voltage signal output by the unmatched power amplifier 410 to appear as an open (substantially infinite impedance).

For purposes of explanation, each of the shunt acoustic resonators 431 and 432, and the series acoustic resonators 434 and 435 in FIG. 4B, and each of the shunt acoustic resonators 441, 442, 443 and 444 in FIG. 4C, is shown as a single acoustic resonator, although it is understood that the required series resonance frequency of each (or one or more)

of the shunt acoustic resonators 431, 432, 442, 442, 443 and 444 may alternatively be provided by multiple acoustic resonators (as opposed to a single acoustic resonator, as shown) having a combined series resonance frequency that matches the required series resonance frequency, without departing from the scope of the present teachings. Likewise, it is understood that the required parallel resonance frequency of each (or one or more) of the series acoustic resonators 434 and 435 may alternatively be provided by multiple acoustic resonators having a combined parallel resonance frequency that matches the required parallel resonance frequency, without departing from the scope of the present teachings.

Notably, the series transmission line 439' in FIG. 4C is depicted thicker than the transmission line 439 in FIG. 4B because, in addition to providing an electrical connection, the series transmission line 439' acts as an impedance transformer since the electrical length of the series transmission line 439' is not relatively short in comparison to the wavelength of the amplified voltage signal. The characteristic impedance of the series transmission line 439' is physically dependent on line width and technically dependent on the application (e.g., from the desired impedance of the load 250). Also, for purposes of explanation, the shunt acoustic resonators 431 and 432, and the series acoustic resonators 434 and 435 in FIG. 4B, and the shunt acoustic resonators 441, 442, 443 and 444 in FIG. 4C, are indicated as FBARs, although it is understood that other types of acoustic resonators, such as SAW resonators may be incorporated, without departing from the scope of the present teachings.

The various components, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. An output network connected to an output of a nonlinear unmatched power amplifier that provides an amplified voltage signal at a fundamental frequency, the output network comprising:
   a harmonic matching network comprising a plurality of acoustic resonators configured to match a plurality of harmonic frequencies of the amplified voltage signal to one of substantially zero impedance, appearing as a short at the output of the nonlinear unmatched power amplifier, or substantially infinite impedance, appearing as an open at the output of the nonlinear unmatched power amplifier, resulting in zero voltage or zero current at higher harmonic frequencies, respectively, to avoid power distribution at the higher harmonic frequencies,
   wherein each higher harmonic frequency of the plurality of matched harmonic frequencies is higher than a first harmonic frequency, which is the fundamental frequency.

2. The output network of claim 1, wherein, to provide a class F power amplifier, the plurality of acoustic resonators comprise:
   at least one shunt acoustic resonator having a corresponding series resonance frequency matching a second harmonic frequency of the plurality of harmonic frequencies to short out the second harmonic frequency at the output of the nonlinear unmatched power amplifier; and
   at least one series acoustic resonator having a corresponding parallel resonance frequency matching a third harmonic frequency of the plurality of harmonic frequencies to provide an open at the third harmonic frequency at the output of the nonlinear unmatched power amplifier output.

3. The output network of claim 2, wherein the plurality of acoustic resonators further comprise:
   a plurality of additional shunt acoustic resonators having corresponding series resonance frequencies respectively matching harmonic frequencies of the plurality of harmonic frequencies higher than the third harmonic frequency to short out the harmonic frequencies higher than the third harmonic frequency at the output of the nonlinear unmatched power amplifier.

4. The output network of claim 1, wherein, to provide a class E power amplifier,
   the plurality of acoustic resonators comprise a plurality of series acoustic resonators having corresponding parallel resonance frequencies respectively matching each higher harmonic frequency of the plurality of harmonic frequencies to provide an open at each higher harmonic frequency at the output of the nonlinear unmatched power amplifier.

5. The output network of claim 1, wherein, to provide a class E power amplifier,
   a series transmission line is connected at the output of the nonlinear unmatched power amplifier and the plurality of acoustic resonators comprise shunt acoustic resonators having corresponding series resonance frequencies, each connected between the series transmission line and reference ground voltage, wherein each shunt acoustic resonator is located at a distance from the output of the nonlinear unmatched power amplifier that provides an electrical length between the shunt acoustic resonator and the output of the nonlinear unmatched power amplifier substantially equal to a quarter wave of a higher harmonic frequency corresponding to the shunt acoustic resonator, causing the higher harmonic frequency to appear as an open at the output of the nonlinear unmatched power amplifier.

6. The output network of claim 5, wherein the distances from the output of the nonlinear unmatched power amplifier and the shunt acoustic resonators, respectively, are shorter for increasingly higher harmonic frequencies.

7. The output network of claim 1, wherein, to provide a class D power amplifier, the plurality of acoustic resonators comprise:
   a plurality of shunt acoustic resonators having corresponding series resonance frequencies respectively matching harmonic frequencies of even harmonics of the plurality of harmonic frequencies at the output of the nonlinear unmatched power amplifier to short out the harmonic frequencies of even harmonics; and
   a plurality of series acoustic resonators having corresponding parallel resonance frequencies respectively matching harmonic frequencies of odd harmonics of the plurality of harmonic frequencies at the output of the nonlinear unmatched power amplifier to provide opens at the higher harmonic frequencies of odd harmonics.

8. The output network of claim 1, wherein, to provide a class D power amplifier, a series transmission line is connected at the output of the nonlinear unmatched power amplifier and the plurality of acoustic resonators comprise shunt acoustic resonators having corresponding series resonance frequencies, each connected between the series transmission line and reference ground voltage, wherein each shunt acoustic resonator is located at a distance from the output of the nonlinear power amplifier that provides an electrical length between the shunt acoustic resonator and the output of the nonlinear power amplifier substantially equal to a quarter wave of a higher harmonic frequency of an odd harmonic corresponding to the shunt acoustic resonator, causing the higher odd harmonic frequency to appear as an open at the output of the nonlinear power amplifier, and wherein the plurality of acoustic resonators further comprise a plurality of additional shunt acoustic resonators each connected between the output of the nonlinear unmatched power amplifier and the reference ground voltage, the additional shunt acoustic resonators having corresponding series resonance frequencies respectively matching higher harmonic frequencies of even harmonics corresponding to the additional shunt acoustic resonators, shorting out the higher harmonic frequencies of the even harmonics at the output of the nonlinear unmatched power amplifier.

9. A matched power amplifier, comprising:
a nonlinear unmatched power amplifier including a transistor connected between a voltage power supply and a reference ground voltage, the transistor providing an amplified voltage signal at an output in response to a variable drive signal, the amplified voltage signal having a fundamental frequency and a corresponding plurality of higher harmonic frequencies, wherein each higher harmonic frequency is higher than the fundamental frequency; and
a harmonic matching network connected to the output of the nonlinear unmatched power amplifier, and configured to receive the amplified voltage signal at the fundamental frequency and to prevent power distribution at the plurality of higher harmonic frequencies of the fundamental frequency, the harmonic matching network comprising:
a plurality of acoustic resonators configured to match the plurality of higher harmonic frequencies of the amplified voltage signal, respectively, to one of substantially zero impedance or substantially infinite impedance; and
a harmonic matching network output; and
a load between the harmonic matching network output and the reference ground voltage.

10. The matched power amplifier of claim 9, wherein the transistor is a field effect transistor (FET) comprising a gate for receiving the variable drive signal, a source connected to the reference ground voltage, and a drain connected to the output of the nonlinear unmatched power amplifier and the voltage power supply.

11. The matched power amplifier of claim 9, wherein the transistor is a bipolar junction transistor (BJT) comprising a base for receiving the variable drive signal, an emitter connected to the reference ground voltage, and a collector connected to the output of the nonlinear unmatched power amplifier and the voltage power supply.

12. The matched power amplifier of claim 9, wherein an impedance of the harmonic matching network is substantially equal to the load between the harmonic matching network output and the reference ground voltage at the fundamental frequency, is substantially infinite at a third harmonic frequency, and is substantially zero at higher harmonic frequencies other than the third harmonic frequency when the matched power amplifier is a class F power amplifier.

13. The matched power amplifier of claim 12, wherein the plurality of acoustic resonators comprise:
at least one shunt acoustic resonator having a corresponding series resonance frequency matching a second harmonic frequency of the plurality of higher harmonic frequencies to short out the second harmonic frequency;
at least one series acoustic resonator having a corresponding parallel resonance frequency matching the third harmonic frequency to provide an open at the third harmonic frequency; and
at least one shunt acoustic resonator having a corresponding series resonance frequency matching a fourth harmonic frequency of the plurality of higher harmonic frequencies to short out the fourth harmonic frequency.

14. The matched power amplifier of claim 9, wherein an impedance of the harmonic matching network is substantially equal to the load between the harmonic matching network output and the reference ground voltage at the fundamental frequency, and is substantially infinite at the higher harmonic frequencies, when the matched power amplifier is a class E power amplifier.

15. The matched power amplifier of claim 14, wherein the plurality of acoustic resonators comprise:
a plurality of series acoustic resonators having corresponding parallel resonance frequencies respectively matching the higher harmonic frequencies to provide opens at the higher harmonic frequencies.

16. The matched power amplifier of claim 14, wherein the harmonic matching network further comprises a series transmission line connected between the output of the nonlinear unmatched power amplifier and the harmonic matching network output, and
wherein the plurality of acoustic resonators comprise shunt acoustic resonators having corresponding series resonance frequencies, each connected between the series transmission line and the reference ground voltage, wherein each shunt acoustic resonator is located at a distance from the output of the of the nonlinear unmatched power amplifier that provides an electrical length between the shunt acoustic resonator and the output of the nonlinear unmatched power amplifier substantially equal to a quarter wave of a higher harmonic frequency corresponding to the shunt acoustic resonator, causing the higher harmonic frequency to appear as an open at the output of the nonlinear unmatched power amplifier.

17. The matched power amplifier of claim 9, wherein an impedance of the harmonic matching network is substantially equal to the load between the harmonic matching network output and the reference ground voltage at the fundamental frequency, is substantially infinite at odd higher harmonic frequencies of the plurality of higher harmonic frequencies, and is substantially zero at even higher harmonic frequencies of the plurality of higher harmonic frequencies, when the matched power amplifier is a class D power amplifier.

18. The matched power amplifier of claim 17, wherein the plurality of acoustic resonators comprise:
a plurality of shunt acoustic resonators having corresponding series resonance frequencies respectively matching harmonic frequencies of even harmonics of the plurality of higher harmonic frequencies to short out the harmonic frequencies of even harmonics; and a plurality of series acoustic resonators having corresponding parallel resonance frequencies respectively matching harmonic frequencies of odd harmonics of the plurality of higher harmonic frequencies to provide opens at the higher harmonic frequencies of odd harmonics.

19. The matched power amplifier of claim 17, wherein the harmonic matching network further comprises a series transmission line connected between the output of the nonlinear unmatched power amplifier and the harmonic matching network output, and wherein the plurality of acoustic resonators comprise shunt acoustic resonators having corresponding series resonance frequencies, each connected between the series transmission line and the reference ground voltage, wherein each shunt acoustic resonator is located at a distance from the output of the nonlinear unmatched power amplifier that provides an electrical length between the shunt acoustic resonator and the output of the nonlinear unmatched power amplifier substantially equal to a quarter wave of a higher harmonic frequency of an odd harmonic corresponding to the shunt acoustic resonator, causing the higher harmonic frequency to appear as an open at the output of the nonlinear unmatched power amplifier, and wherein the plurality of acoustic resonators further comprise a plurality of additional shunt acoustic resonators each connected between the output of the nonlinear unmatched power amplifier and the reference ground voltage, the additional shunt acoustic resonators having corresponding series resonance frequencies respectively matching higher harmonic frequencies of even harmonics corresponding to the additional shunt acoustic resonators, shorting out the higher harmonic frequencies of the even harmonics.

* * * * *